US008435051B2

(12) United States Patent
Tonosaki

(10) Patent No.: US 8,435,051 B2
(45) Date of Patent: May 7, 2013

(54) BOARD CONNECTOR AND METHOD OF MOUNTING IT

(75) Inventor: Takashi Tonosaki, Yokkaichi (JP)

(73) Assignee: Sumitomo Wiring Systems, Ltd. (JP)

( * ) Notice: Subject to any disclaimer, the term of this patent is extended or adjusted under 35 U.S.C. 154(b) by 176 days.

(21) Appl. No.: 13/095,160

(22) Filed: Apr. 27, 2011

(65) Prior Publication Data

US 2011/0281462 A1 Nov. 17, 2011

(30) Foreign Application Priority Data

May 13, 2010 (JP) ................................ 2010-110942

(51) Int. Cl.
*H01R 12/00* (2006.01)
*H05K 1/00* (2006.01)

(52) U.S. Cl.
USPC ............................................ 439/79; 439/567

(58) Field of Classification Search .................. 439/592, 439/79, 140, 567, 607.4, 751
See application file for complete search history.

(56) References Cited

U.S. PATENT DOCUMENTS

| | | | | |
|---|---|---|---|---|
| 5,591,036 | A * | 1/1997 | Doi et al. | 439/79 |
| 6,273,732 | B1 * | 8/2001 | Johnescu et al. | 439/79 |
| 6,749,445 | B1 * | 6/2004 | Chen | 439/79 |
| 6,866,552 | B2 * | 3/2005 | Koehler | 439/892 |
| 7,059,872 | B2 * | 6/2006 | Tanaka et al. | 439/79 |
| 7,357,670 | B2 * | 4/2008 | Tanaka | 439/567 |
| 7,708,572 | B2 * | 5/2010 | Yang et al. | 439/140 |

FOREIGN PATENT DOCUMENTS

| | | |
|---|---|---|
| JP | 09-283241 | 10/1997 |

* cited by examiner

*Primary Examiner* — Hae Moon Hyeon
(74) *Attorney, Agent, or Firm* — Gerald E. Hespos; Michael J. Porco; Matthew T. Hespos

(57) ABSTRACT

A housing (10) has inserting portions (63) with projections (17) formed with slits (19). An alignment plate (60) is mounted movably on the housing (10) and has inserting portions (63) that enter the slits (19) of the projections (17). The alignment plate (60) is displaced relative to the housing (10) in the process of mounting a housing (10) on a board (90) due to interference with the board (90) and the inserting portions (63) move deeper into the slits (19). The projections (17) widen the slits (19) as the inserting portions (63) move deeper into the slits (19) and hence leading ends of the projections (17) engage opening edges of the mounting holes (92) of the board (90) to fix the housing (10) to the board (90).

6 Claims, 13 Drawing Sheets

BOARD CONNECTOR AND METHOD OF MOUNTING IT

BACKGROUND OF THE INVENTION

1. Field of the Invention

The invention relates to a board connector.

2. Description of the Related Art

Japanese Unexamined Patent Publication No. H09-283241 discloses a conventional board connector. This connector includes a housing to be mounted on a circuit board and an alignment plate mounted on the housing. The alignment plate has positioning holes that receive and position leading ends of terminal fittings pulled out from the housing. Two legs project from the bottom surface of the housing and engage the circuit board. Screws penetrate through the circuit board and engage the legs to fix the housing to the circuit board. The use of screws to fix the above-described housing on the circuit board requires a separate series of operational steps and creates a large operational burden.

Clips have been considered in place of screws to provide a one-touch operation for fixing a housing to a circuit board. The clips could be inserted into mounting holes of the circuit board and resiliently deformable locking claws formed on the clips could engage opening edges of the mounting holes of the circuit board. However, the locking claws may be deformed inadvertently in unlocking directions with the housing supported on the circuit board and locking strength tends to lack reliability.

The invention was developed in view of the above situation and an object thereof is to allow for improved operability when mounting a housing of a board connector on a circuit board and improved reliability in locking strength.

SUMMARY OF THE INVENTION

The invention relates to a board connector with a housing that is to be mounted on a circuit board. The housing has at least one projection to be inserted into a respective mounting hole of the circuit board. The connector also has at least one displacing member to be mounted displaceably relative to the housing. The displacing member is formed with at least one inserting portion and the projection is formed with an insertion space for receiving the inserting portion. The displacing member is displaced in the process of mounting the housing on the circuit board due to interference with the circuit board. The projection is inserted into the mounting hole of the circuit board and the inserting portion is inserted toward a back side of the insertion space. A leading end of the projection engages an opening edge of the mounting hole of the circuit board when the housing is mounted completely on the circuit board. Thus, the housing is fixed to the circuit board by a one-touch mounting operation. Additionally, the inserting portion is inserted farther toward the back of the insertion space and deforms the projection to widen the insertion space and to prevent a resilient deformation of the projection. Accordingly, the housing is fixed to the circuit board with improved locking reliability and enhanced locking strength.

Terminal fittings are pulled out to project from the housing. The displacing member preferably is an alignment plate with positioning holes for receiving and positioning the terminal fittings. Thus, the construction of the connector is simplified as compared with the case where a special displacing member is provided separately from the alignment plate. Projecting amounts of the terminal fittings from the positioning holes increase as the alignment plate is displaced in the mounting process of the housing. Thus, the terminal fittings are protected by the edges of the positioning holes before the displacement of the alignment plate and the projecting amounts of the terminal fittings from the positioning holes increase to ensure sufficient soldering margins of the terminal fittings to the circuit board after the displacement of the alignment plate.

A mounting direction of the housing on the circuit board is a thickness direction of the circuit board. The insertion space is open in the thickness direction of the circuit board at the leading end of the projection. Additionally, the inserting portion is displaced in the thickness direction of the circuit board in the insertion space. Thus, the mounting operation of the housing on the circuit board and the displacement of the inserting portion in the insertion space can be linked by a relatively simple construction.

The displacing member preferably is placed on a surface of the circuit board and the inserting portion preferably is inserted into the insertion space from the surface side of the circuit board in the mounting process of the housing. Thus, it is not necessary to bypass the inserting portion toward the underside of the circuit board when forming the inserting portion on the displacing member. Therefore the construction can be simplified further.

The insertion space preferably has a depth substantially corresponding to an entire projecting distance of the projecting portion and is formed to gradually reduce its width from an opening side toward a back side.

These and other, features and advantages of the invention will become more apparent upon reading of the following detailed description of preferred embodiments and accompanying drawings. It should be understood that even though embodiments are separately described, single features thereof may be combined to additional embodiments.

DETAILED DESCRIPTION OF THE PREFERRED EMBODIMENTS

A board connector in accordance with an embodiment of the invention has a housing 10, terminal fittings 50 and an alignment plate 60. The housing 10 is mountable on a device such as a printed circuit board 90 and is connectable to an unillustrated mating housing. In the following description, an end to be connected with the mating housing is referred to as the front end concerning forward and backward directions and an end of the board 90 on which the housing 10 is to be mounted is referred to as an upper side concerning a vertical direction.

Figure 1:
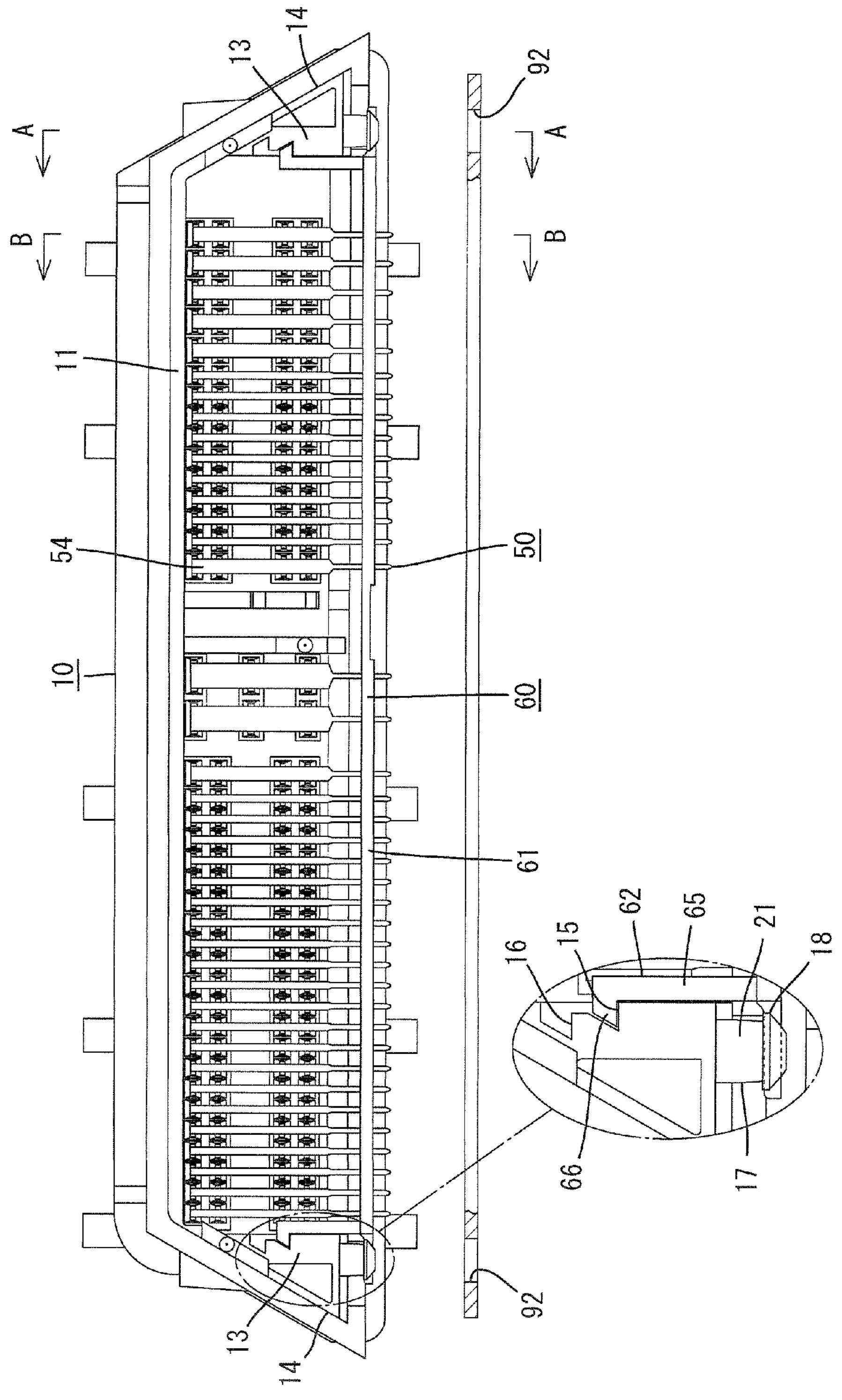
FIG. 1 is a rear view showing a state before a circuit board according to one embodiment of the present invention is mounted on a circuit board.
Figure 6:
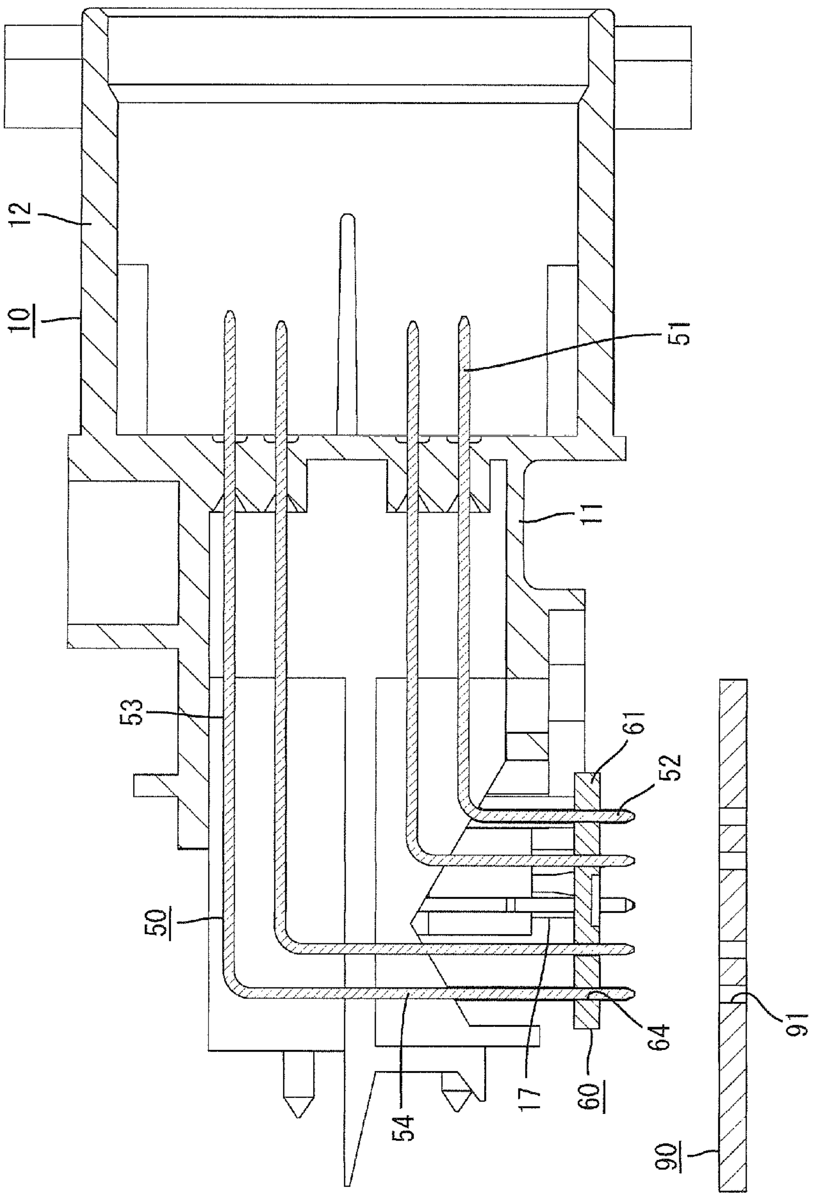
FIG. 6 is a section along B-B of FIG. 1.
Figure 10:
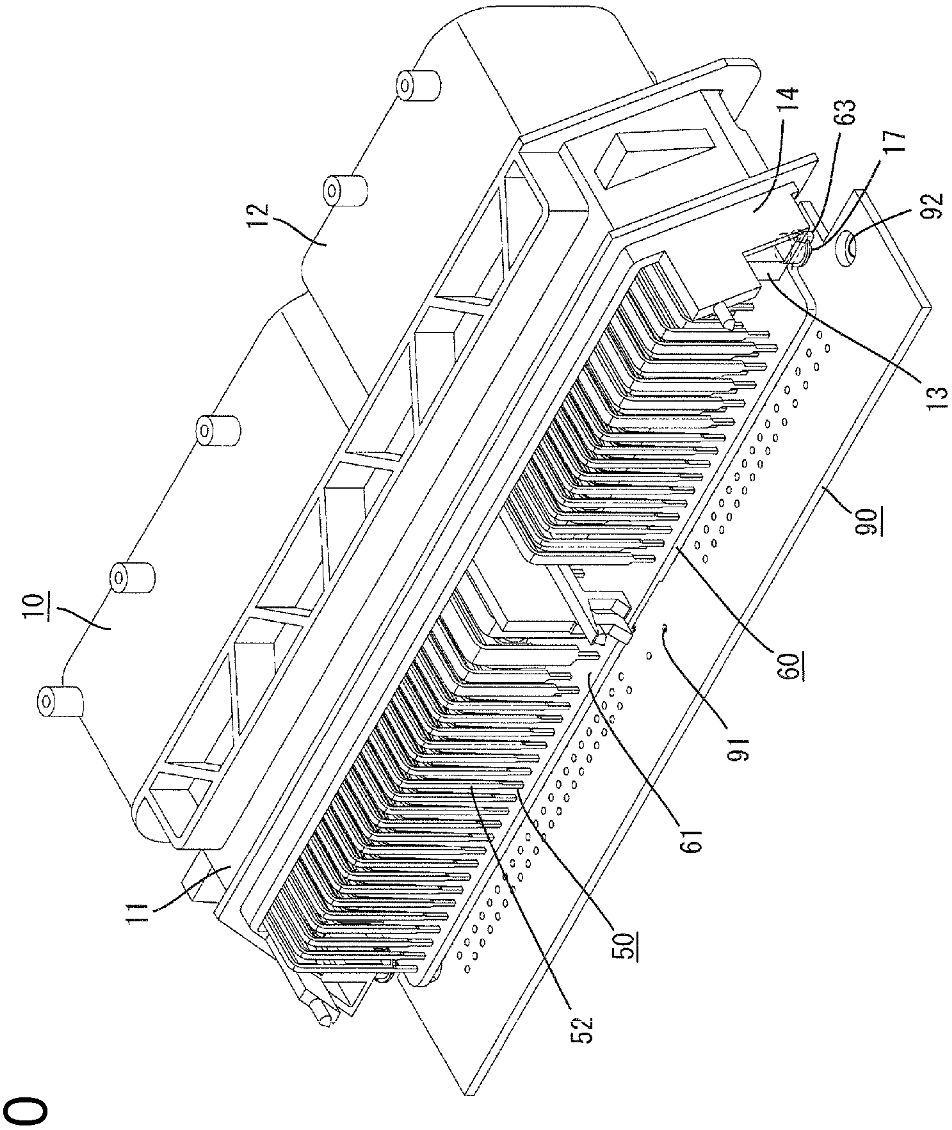
FIG. 10 is a perspective view showing a state before the board connector is mounted on the circuit board.

The housing 10 is made e.g. of synthetic resin and has a flat shape that is long and narrow in a width direction. The housing 10 includes a terminal mounting portion 11 substantially in the form of a back plate, through which the terminal fittings 50 are to be mounted. A rectangular tubular receptacle 12 projects forward from the peripheral edge of the terminal mounting portion 11, as shown in FIGS. 1, 6 and 10.

Each terminal fitting 50 is made of an electrically conductive material, such as metal, and is substantially pin-shaped as a whole. Each terminal fitting includes a mating terminal connecting portion 51 that projects through the terminal mounting portion 11 and into the receptacle 12. A board connecting portion 52 is pulled out from the rear surface of the terminal mounting portion 11 and is exposed outside the housing 10. The mating terminal connecting portion 51 is connected electrically conductively to a mating terminal fitting of the mating housing in the receptacle 12 as the housing 10 is connected to the mating housing. The board connecting portion 52 has a first section 53 pulled out substantially horizontally from the rear surface of the housing 10 and a second section 54 bent substantially at a right angle at the rear end of the first section 53 to extend substantially vertically down. A leading end of the second section 54 is inserted into a connection hole 91 that penetrates the board 90 and connected thereto e.g. soldered.

Two side walls 13 project from opposite widthwise sides of the terminal mounting portion 11. The board connecting portions 52 of the respective terminal fittings 50 are protected by the side walls 13 at the opposite lateral sides. Each side wall 13 has a substantially right triangular cross section with has two oblique surfaces 14, the spacing of which is widened toward a lower side. The both oblique surfaces 14 are formed also on the opposite widthwise side surfaces of the terminal mounting portion 11.

A partial locking portion 15 and a full locking portion 16 are formed one above the other in the vertical direction on of the facing inner surfaces of the side walls 13. The partial locking portions 15 and the full locking portions 16 are formed as recesses in the inner surfaces of the side walls 13, with the full locking portions 16 arranged at an upper side and the partial locking portions 15 arranged at a lower side. Two projections 17 project down from the bottom surface (surface facing the top surface of the board 90) of the both side walls 13.

Figure 2:
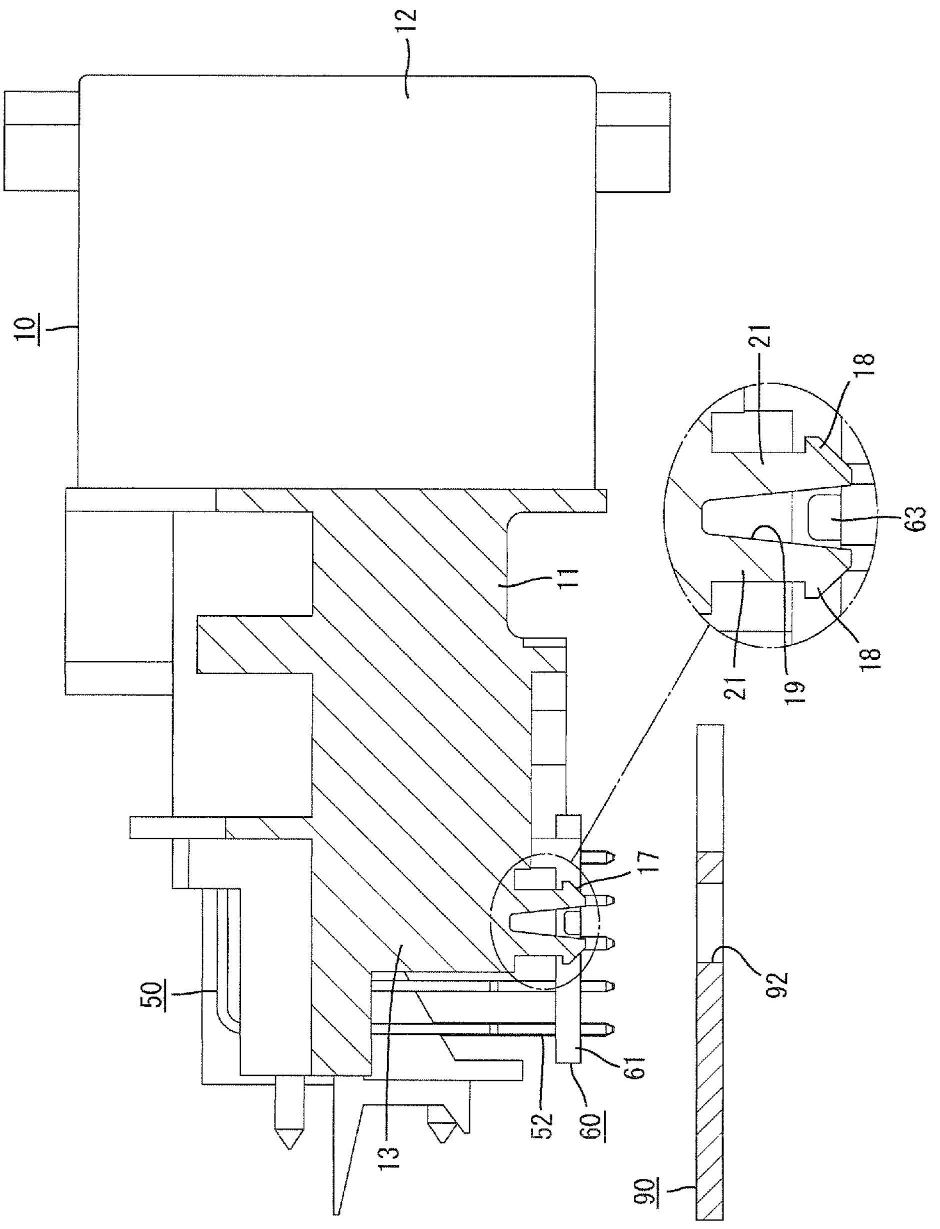
FIG. 2 is a section along A-A of FIG. 1.

Each projection 17 has a substantially cylindrical shape and a flange 18 bulges radially out at a leading end portion thereof. The board 90 has mounting holes 92 at positions corresponding to the projections 17, and the projections 17 are inserted into the mounting holes 92. As shown in FIG. 2, each projection 17 includes at least one slit 19 extending substantially in a width direction. The slit 19 has a depth corresponding to substantially an entire projecting distance of the projection 17 and the width gradually reduces from an opening side toward a back side. Each projection 17 also has two legs 21 arranged at opposite sides of the slit 19 and resiliently deformable in forward and backward directions. The legs 21 do not project as far as the bottom ends of the terminal fittings 50 so that the leading ends of the legs 21 are above the bottom ends of the respective terminal fittings 50 and are slightly below the lower surface of the alignment plate 60.

The alignment plate 60 is made e.g. of synthetic resin, and is long and narrow in the width direction. The alignment plate 60 is arranged at a rear side of a bottom part of the housing 10 and is vertically displaceable relative to the housing 10 between the partial locking position and a full locking position as the housing 10 is mounted on the board 90.

Figure 11:
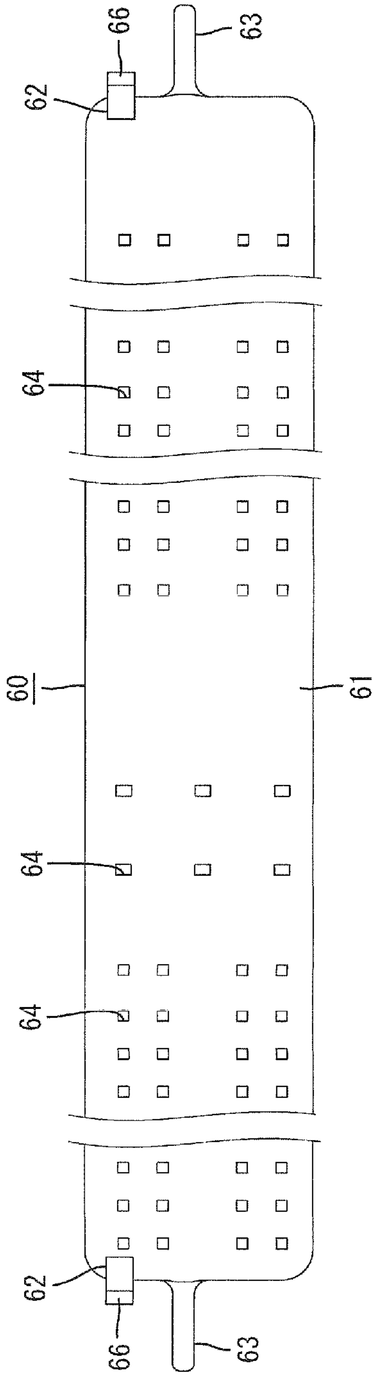
FIG. 11 is a plan view of the alignment plate.
Figure 12:
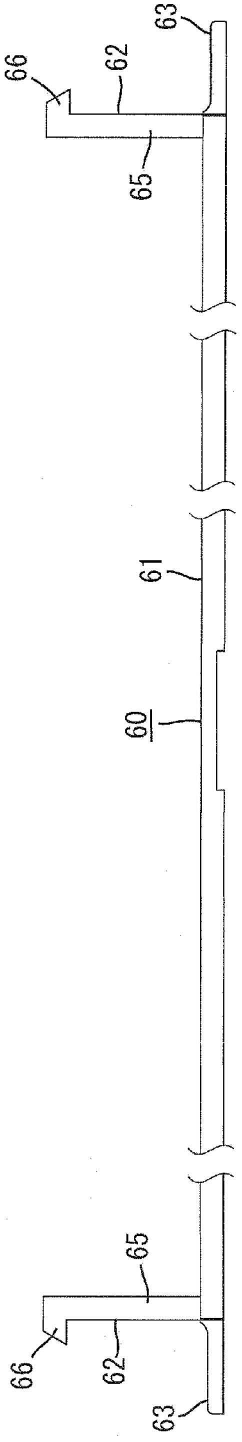
FIG. 12 is a front view of the alignment plate.
Figure 13:
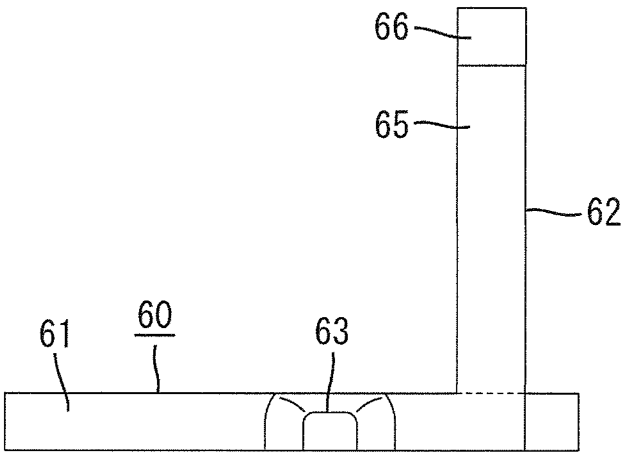
FIG. 13 is a side view of the alignment plate.

The alignment plate 60 includes a substantially rectangular plate main body 61 that is long and narrow in the width direction. Locks 62 project up from opposite widthwise ends of the plate main body 61 and two inserting portions 63 project outward in the width direction from the opposite widthwise ends of the plate main body 61, as shown in FIGS. 11 to 13. The locks 62 are arranged at a front end portion of the plate main body 61 and the inserting portions 63 are arranged behind the locks 62 in a substantially central part of the plate main body 61 in forward and backward directions.

The plate main body 61 has positioning holes 64 at positions substantially corresponding to the respective terminal fittings 50. The leading ends of the vertical sections 54 of the respective terminal fittings 50 are inserted through the corresponding positioning holes 64 while being positioned. Downward projecting amounts of the leading end portions of the terminal fittings 50 from the positioning holes 64 are small at the partial locking position to keep the leading end portions of the terminal fittings 50 in a protected state. Downward projecting amounts of the leading end portions of the terminal fittings 50 from the positioning holes 64 are increased at the full locking position to ensure sufficient soldering margins to the board 90.

Each lock 62 has a resilient piece 65 and a pointed locking claw 66 that projects out in the width direction from the upper end of the resilient piece 65. The resilient piece 65 is resiliently deformable substantially in the width direction with a base part connected to the plate main body 61 as a support.

Figure 8:
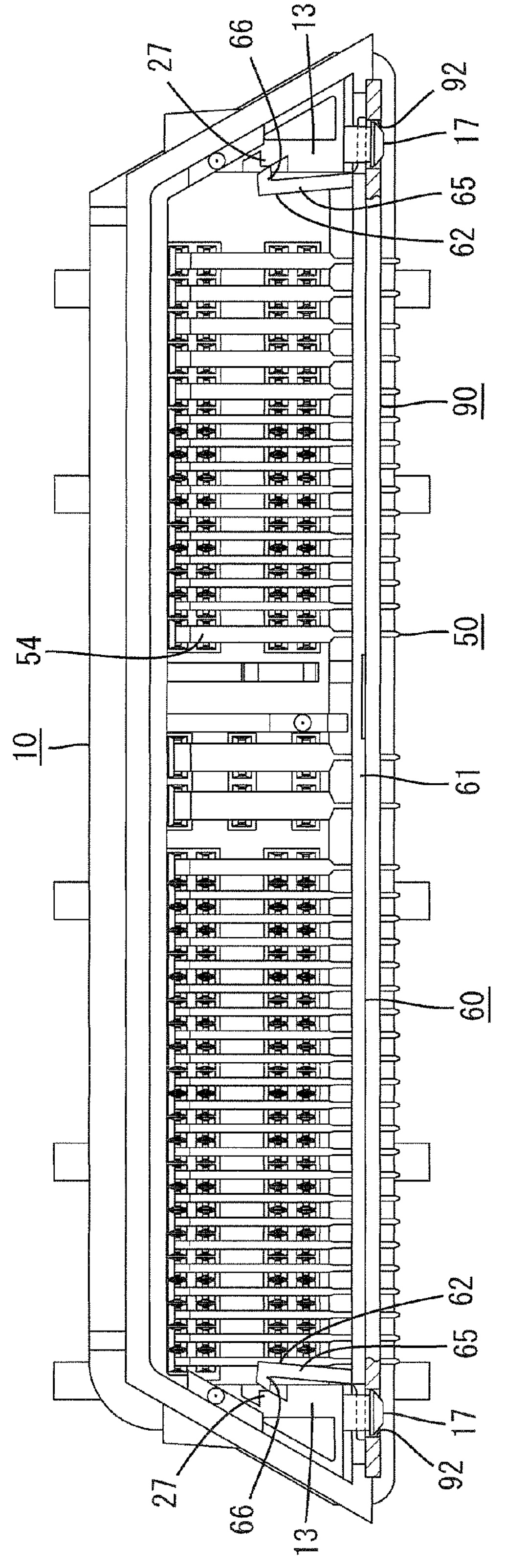
FIG. 8 is a rear view showing a state of the moving process of the alignment plate from the partial locking position to the full locking position.

The locking claws 66 can fit into the partial locking portions 15 to hold the alignment plate 60 at the partial locking position and can fit into the full locking portions 16 to hold the alignment plate 60 at the full locking position. The locking claws 66 slide in contact with projecting walls 27 between the partial locking portions 15 and the full locking portions 16 to deform the resilient pieces 65, as shown in FIG. 8, thereby permitting the alignment plate 60 to displace between the partial locking position and the full locking position.

The inserting portions 63 are substantially rectangular bars with beveled or rounded outer edges and are arranged substantially horizontally and continuous with the plate main body 61. The inserting portions 63 normally are kept inserted in the slits 19 of the projections 17 and move toward the back sides of the slits 19 as the alignment plate 60 is moved from the partial locking position to the full locking position. Specifically, the inserting portions 63 are arranged at openings of the slit grooves 19 at the leading ends of the projections 17 at the partial locking position while being arranged at the back ends of the slits 19 at the base end sides of the projections 17 at the full locking position. The thickness (dimension in forward and backward directions) of the inserting portions 63 is substantially equal to the width of the openings of the slits 19 and larger than the width of the back ends of the slits 19.

Figure 3:
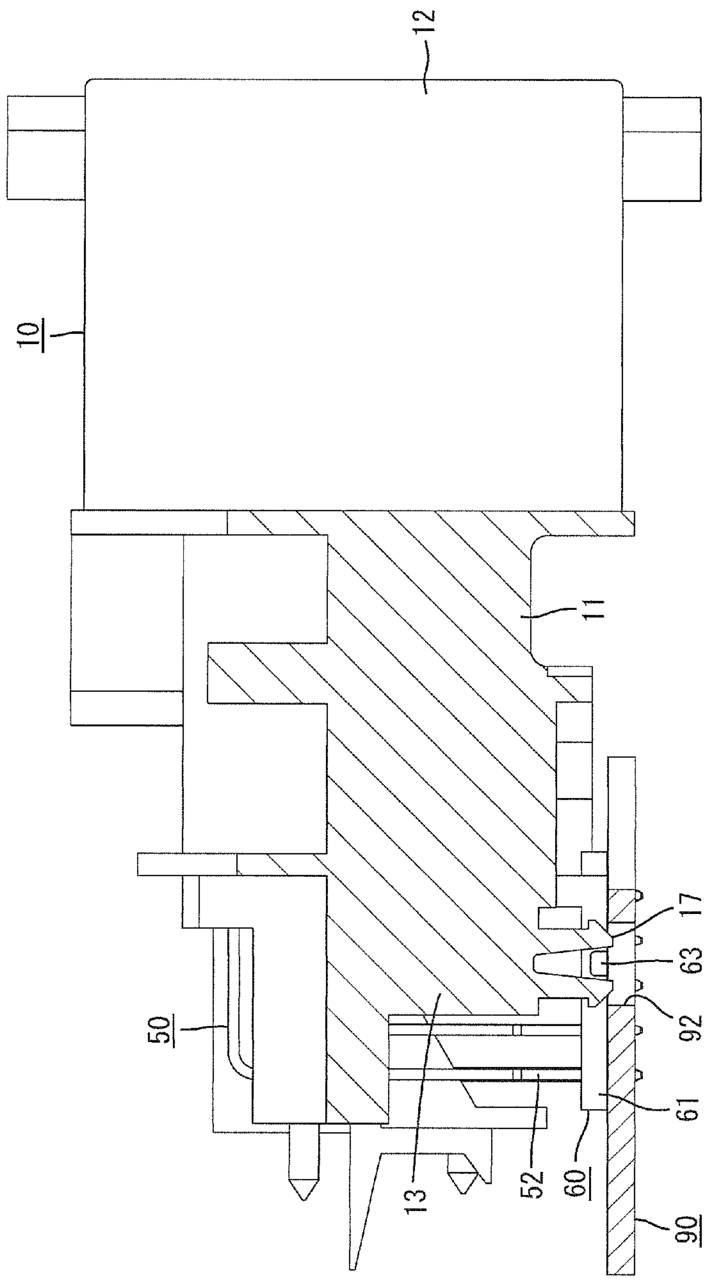
FIG. 3 is a section showing a state immediately after an alignment plate interferes with the circuit board.
Figure 7:
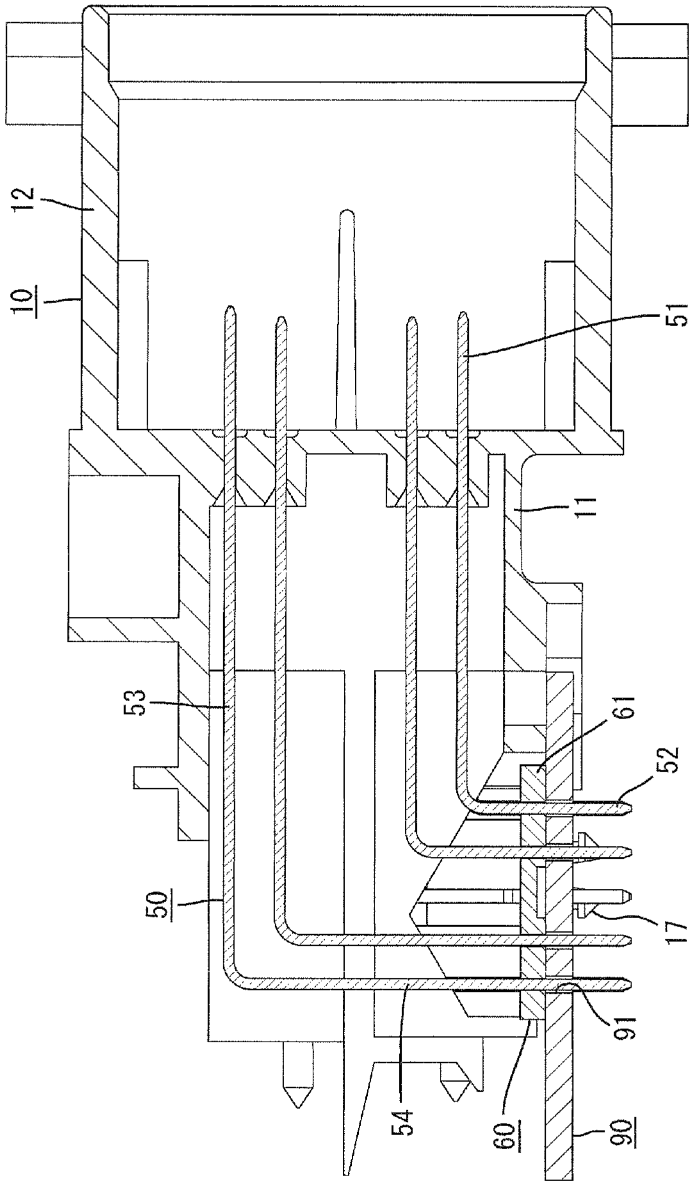
FIG. 7 is a section, corresponding to FIG. 6, showing a state where the alignment plate is at the full locking position.

The housing 10 is to be mounted on the electrical device such as the board 90 with the alignment plate 60 held at the partial locking position on the housing 10. At this time, the receptacle 12 is arranged to project laterally outwardly of the end portion of the board 90 (see FIG. 7). In the mounting process, the leading ends of the terminal fittings 50 are inserted into the connection holes 91 and subsequently the alignment plate 60 is placed on the top surface of the board 90 (see FIG. 3). At this time, the leading ends of the projections 17 are inserted slightly into the opening sides of the mounting hole 92. A downward pushing force then is applied to the housing 10 with the alignment plate 60 on the top surface of the board 90. Thus, a shear force is produced between the housing 10 and the alignment plate 60 and the locking claws 66 and the partial locking portions 15 are disengaged. As a result that the alignment plate 60 is displaced toward the full locking position relative to the housing 10.

Figure 4:
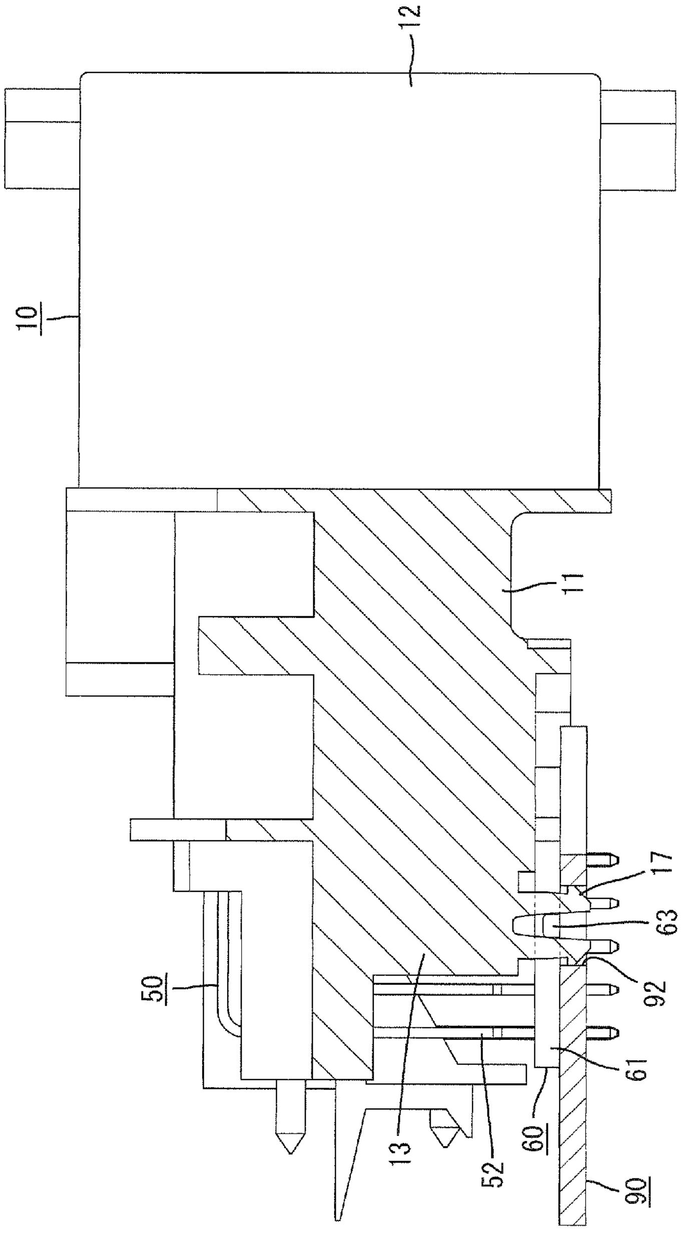
FIG. 4 is a section showing a state of a moving process of the alignment plate from a partial locking position to a full locking position.
Figure 5:
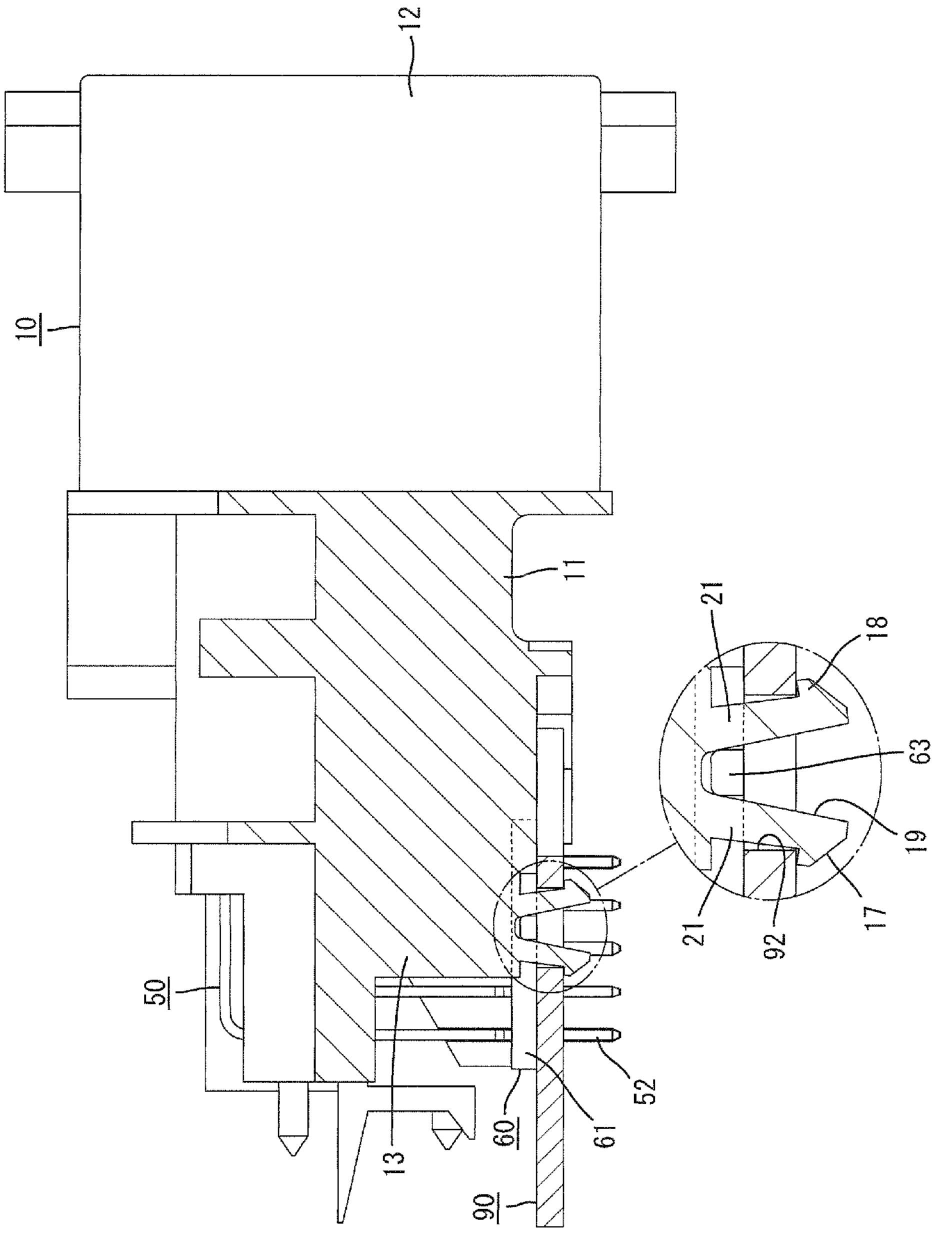
FIG. 5 is a section showing a state where the alignment plate is at the full locking position and leading ends of projecting portions are engaged with opening edge portions on the underside of the circuit board.
Figure 9:
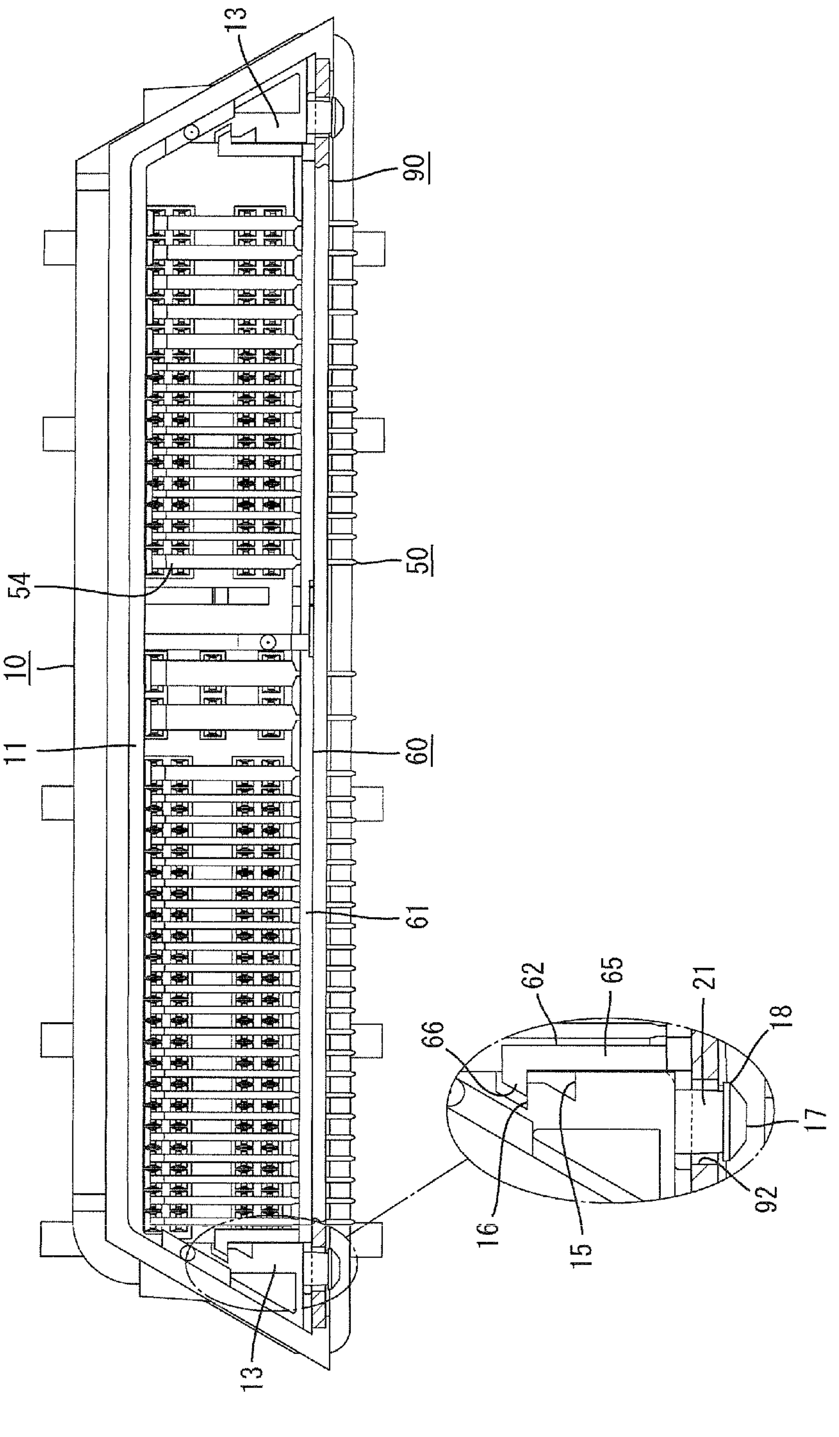
FIG. 9 is a rear view showing the state where the alignment plate is at the full locking position.

Lowering the housing 10 has several effects. First, the alignment plate 60 moves toward the full locking position. Second, the leading ends of the projections 17 move through into the mounting holes 92. Third, the inserting portions 63 move up deeper in the slits 19 of the projections 17. Fourth, the leading ends of the terminal fittings 50 gradually project farther out from the underside of the board 90 (see FIG. 4). When the housing 10 is supported on the top surface of the board 90 and the alignment plate 60 reaches the full locking position, the locking claws 66 are fit into the full locking portions 16 to hold the alignment plate 60 at the full locking position (see FIG. 9). When the alignment plate 60 reaches the full locking position, the leading ends of the projections 17 are located on the underside of the board 90, the inserting portions 63 reach the back ends of the slits 19, the legs 21 are deformed maximally and the flanges 18 engage opening edges of the mounting holes 92 on the underside of the board 90 to be retained (see FIG. 5). In this way, the housing 10 is fixed to the board 90 via the alignment plate 60. Thereafter, the leading ends (board connecting portions 52) of the terminal fittings 50 are connected electrically (soldered) to conductive paths of the board 90 and the housing 10 is connected to the mating housing so that the mating terminal connecting portions 51 of the terminal fittings 50 are connected electrically conductively to the mating terminal fittings.

As described above, the alignment plate 60 is displaced relative to the housing 10 due to interference with the board 90, the inserting portions 63 are inserted toward the back sides of the slits 19 and/or the projections 17 are inserted into the mounting holes 92 of the board 90 in the process of mounting the housing 10 on the board 90. On the other hand, when the mounting of the housing 10 on the board 90 is completed, the leading ends of the projections 17 are engaged with the opening edges of the mounting holes 92 of the board 90 with the deformed amounts of the projections 17 increased by the inserting portions 63 inserted farther toward the backs of the slits 19. Thus, the housing 10 is fixed to the board 90 easily by a one-touch operation, thereby increasing operational efficiency. When the mounting of the housing 10 on the board 90 is completed, the inserting portions 63 are located in the slits 19 of the projections 17 to prevent deformation of the projections 17 and to improve reliability in locking strength.

The entire construction can be simplified as compared with the case where a special displacing member is prepared separately from the alignment plate 60. In addition, the projecting amounts of the terminal fittings 50 from the positioning holes 64 increases as the alignment plate 60 is displaced in the mounting process of the housing 10. Thus, the terminal fittings 50 are protected by the hole edges of the positioning holes 64 before the displacement of the alignment plate 60 and the projecting amounts thereof from the positioning holes 64 increase to ensure sufficient connection soldering margins of the terminal fittings 50 to the board 90 after the displacement of the alignment plate 60.

Further, a mounting direction of the housing 10 to the board 90 is oriented in a thickness direction of the board 90, the slits 19 are open in the thickness direction of the board 90 at the leading ends of the projections 17 and the inserting portions 63 are displaced in the thickness direction of the board 90 in the slits 19. Thus, the mounting operation of the housing 10 to the board 90 and the displacements of the inserting portions 63 in the slit grooves 19 can be linked by a relatively simple construction.

Furthermore, the alignment plate 60 is to be placed on the top surface of the board 90 and the inserting portions 63 are inserted into the slits 19 of the projections 17 from the top side of the board 90 in the mounting process of the housing 10. Thus, it is not necessary to bypass the inserting portions 63 toward the underside of the board 90 upon forming the inserting portions 63 on the alignment plate 60 to simplify the construction.

The invention is not limited to the above described and illustrated embodiment. For example, the following embodiments are also included in the technical scope of the present invention as defined by the claims.

Instead of the alignment plate, a special displacing member including inserting portions to be inserted into the slits (insertion spaces) of the projections may be mounted on the housing.

The slits (insertion spaces) may be formed to be open in a plate surface direction of the circuit board at the leading end portions of the projecting portions, the displacing member may be displaced in the plate surface direction of the circuit board as it interferes with the circuit board, and the inserting portions may be inserted toward the back sides of the slits (insertion spaces) from a lateral side.

The displacing member (alignment plate) may be displaced due to interference with another member mounted on the circuit board without directly interfering with the circuit board.

The inserting portions may not be inserted in the slit grooves (insertion grooves) when the displacing member (alignment plate) is at the partial locking position.

What is claimed is:

1. A board connector, comprising:

a housing to be mounted on a circuit board and including at least one projection to be inserted into at least one respective mounting hole of the circuit board; and at least one displacing member mounted displaceably relative to the housing; wherein:

the displacing member is formed with at least one inserting portion and the projection is formed with an insertion space into which the inserting portion is inserted, in the process of mounting the housing on the circuit board, the displacing member is displaced due to interference with the circuit board, the inserting portion is inserted toward a back side of the insertion space and the projecting portion is inserted into the mounting hole of the circuit board; and when the mounting of the housing on the circuit board is completed, a leading end of the projection is engaged with an opening edge portion of the mounting hole of the circuit board with the projection deformed to widen the insertion space by the inserting portion inserted further toward the back side of the insertion space to fix the housing to the circuit board.

2. The board connector of claim 1, further comprising:

terminal fittings projecting outwardly from the housing;

the displacing member being an alignment plate including positioning holes into which the terminal fittings can be inserted while being positioned; and projecting amounts of the terminal fittings from the positioning holes increase as the alignment plate is displaced while mounting the housing.

3. The board connector of claim 2, wherein:

a mounting direction of the housing on the circuit board is a thickness direction of the circuit board;

the insertion space is open in a thickness direction of the circuit board at a leading end of the projection; and the inserting portion is displaced in the thickness direction of the circuit board in the insertion space.

4. The board connector of claim 3, wherein the displacing member is placed on a surface of the circuit board and the inserting portion is inserted at least partly into the insertion space from the surface of the circuit board while mounting the housing.

5. The board connector of claim 1, wherein the insertion space is formed with a depth substantially corresponding to an entire projecting distance of the projection and has a width that is reduced gradually from an opening side toward a back side.

6. A board connector, comprising:

a housing with a mounting surface to be mounted on a circuit board, projections projecting beyond the mounting surface of the housing, each projection having two legs and a slit between the legs, the slit narrowing at positions closer to the mounting surface of the housing;

terminal fittings mounted in the housing and having board connecting ends projecting beyond the mounting surface of the housing; and an alignment plate having positioning holes slidably accommodating the board connecting ends of the terminal fittings, the alignment plate being movable substantially normal to the mounting surface of the housing from a first position where the board connecting ends of the terminal fittings project at least into the positioning holes to a second position where the board connecting ends of the terminal fittings project farther through the positioning holes, the alignment plate further including inserting portions projecting into the slits of the projection, the inserting portions moving deeper into the slit and being dimensioned to deflect the legs away from one another as the alignment plate moves from the first position to the second position on the housing.

* * * * *